US010386052B2

(12) United States Patent
Jonsson

(10) Patent No.: US 10,386,052 B2
(45) Date of Patent: Aug. 20, 2019

(54) METHOD OF IDENTIFYING A MALFUNCTION IN A LASER-DRIVEN REMOTE PHOSPHOR LUMINAIRE

(71) Applicant: TRIDONIC GMBH & CO KG, Dornbirn (AT)

(72) Inventor: Karl Jonsson, Rancho Santa Margarita, CA (US)

(73) Assignee: TRIDONIC GMBH & CO KG, Dornbirn (AT)

( * ) Notice: Subject to any disclaimer, the term of this patent is extended or adjusted under 35 U.S.C. 154(b) by 54 days.

(21) Appl. No.: 15/864,044

(22) Filed: Jan. 8, 2018

(65) Prior Publication Data

US 2019/0212002 A1   Jul. 11, 2019

(51) Int. Cl.
| | |
|---|---|
| *G02B 27/20* | (2006.01) |
| *F21V 23/04* | (2006.01) |
| *F21S 41/14* | (2018.01) |
| *H01S 3/00* | (2006.01) |
| *G02B 5/28* | (2006.01) |
| *G02B 13/14* | (2006.01) |
| *F21S 45/70* | (2018.01) |

(52) U.S. Cl.
CPC .......... *F21V 23/0442* (2013.01); *F21S 41/14* (2018.01); *F21S 45/70* (2018.01); *G02B 5/282* (2013.01); *G02B 13/146* (2013.01); *H01S 3/0071* (2013.01)

(58) Field of Classification Search
None
See application file for complete search history.

(56) References Cited

U.S. PATENT DOCUMENTS

| | | | | |
|---|---|---|---|---|
| 6,153,985 A | * | 11/2000 | Grossman | .......... H05B 33/0851 315/149 |
| 8,400,011 B2 | | 3/2013 | Kawaguchi et al. | |
| 9,261,259 B2 | | 2/2016 | Shiomi et al. | |

* cited by examiner

*Primary Examiner* — Vip Patel
(74) *Attorney, Agent, or Firm* — Andrus Intellectual Property Law

(57) ABSTRACT

A luminaire includes a phosphor that emits non-coherent, visible light when excited, a laser diode that emits a laser beam to excite the phosphor, and a driver that outputs electrical DC power at or above the voltage level necessary to drive the laser diode. The current output from the driver to the laser diode is modulated with a code, preferably a random generated code. A visible light sensor detects light emitted from the phosphor and provides a feedback signal, which contains the code under normal operation. If the proper code is not detected in the feedback signal, power output to the laser diode is immediately ceased or reduced to a level safe for the human eye.

23 Claims, 3 Drawing Sheets

METHOD OF IDENTIFYING A MALFUNCTION IN A LASER-DRIVEN REMOTE PHOSPHOR LUMINAIRE

FIELD OF THE INVENTION

The invention pertains to the identification of a malfunction in a laser-based remote phosphor luminaire, for example, in order to immediately shutdown the laser for safety reasons.

BACKGROUND OF THE INVENTION

Laser-based remote phosphor lighting systems are an emerging trend, especially in the automobile industry but may soon be used in other applications for general illumination such as street lights for example. In these systems, a beam from a laser diode excites the phosphor, which in turn emits non-coherent light. One of the more critical limitations to widespread use of laser phosphor lighting systems is the safety of such systems when malfunction or physical damage occurs. For example, in an automobile crash, the laser beam might point away from the target (phosphor) into the open air. If using lasers in the range of 5 watts or more, this can be dangerous, causing a fire hazard and/or severe damage to the skin or the eyes of observers. This is one reason that the use of laser-driven headlights in the United States has been limited.

U.S. Pat. No. 8,400,011, entitled "Illumination Device, Automotive Lighting Equipment, and Vehicle", issued on Mar. 19, 2013 to Kawaguchi et al. describes a system for sensing a malfunction in a laser-driven fluorescent lighting system. The system disclosed in the '011 patent uses a photodiode to detect the presence of reflected light at the wavelength of the laser. It discloses the use of a fluorescent plate having a reflective region within the region on the fluorescent plate that the laser beam is designed to irradiate. Under normal operation, a portion of the laser beam is reflected from the reflective region of the fluorescent plate, while the remaining portion of the laser beam excites the fluorescent phosphor. The purpose of the photodiode is to detect the presence of reflected light at the wavelength of the laser. However, if there is structural damage to the fluorescent plate and its reflective region, such as in an automobile crash, and the photodiode is not able to detect the presence of the reflected light at the wavelength of the laser, and the system will automatically shut down the laser diode for safety purposes. One drawback is that this safety system requires that the fluorescent plate be manufactured with a reflective region. In one embodiment, see FIG. 13 in the '011 patent, Kawaguchi et al. explain that the reflective region on the fluorescent plate may not be necessary because the fluorescent plate may itself sufficiently reflect the laser beam without the aid of a reflective region. In this embodiment, Kawaguchi et al. describe the use of an optical filter to block light illuminated from the fluorescent plate except for light at the wavelength corresponding to that emitted from the laser diode. One of the drawbacks of either system described in the '011 patent is the risk that a malfunction is not detected because the photodiode continues to detect light at the wavelength of the laser beam, even though there is structural damage to the luminaire. For example, after an automobile crash, detected light could come from another light source, or from the laser beam reflected from another damaged component. The present invention is designed to address these issues.

SUMMARY OF THE INVENTION

The invention pertains to identifying a malfunction in a laser-driven remote phosphor luminaire. The luminaire includes a phosphor that emits non-coherent, visible light when excited, a laser diode that emits a laser beam to excite the phosphor, and a driver that outputs electrical DC power at or above the voltage level necessary to drive the laser diode. The non-coherent light emitted from the phosphor would typically be emitted through a lens to illuminate the surrounding environment. In response to identifying a malfunction in the luminaire, the laser diode is immediately shut down for safety purposes. Alternatively, the power to the laser diode can be cut so that the outputted laser is safe to the human eye in case of a malfunction.

In one aspect, the invention is directed to a method in which the current output from the driver to the laser diode is modulated with a code. The modulation can take various forms such as pulse position modulation (PPM) or pulse width modulation (PWM). Consequently, the laser diode outputs a modulated high-powered laser beam that irradiates the phosphor and excites the phosphor according to the code. The phosphor emits visible light, and a visible light optical sensor senses the light emitted from the phosphor and outputs a feedback signal. Ideally, a band stop optical filter, or a low pass filter, that blocks the wavelength of the light of the laser beam is used to filter the light detected by the optical sensor. The modulated output current from the driver is modulated having a high duty cycle and a frequency set to avoid flicker detectable by the human eye, e.g. desirably no lower than 500 Hz, and more desirably between 1 kHz and 5 kHz. Microcontrollers currently available are capable of controlling modulation between 1 kHz and 5 kHz. At frequencies above 10 kHz, there is a risk that the phosphor may reach saturation.

The code is embedded in the current output from the driver and, under normal operation, also in the feedback signal from the optical sensor representing the instantaneous intensity of non-coherent light from the phosphor. The feedback signal is compared to the code, desirably by the microcontroller, and as long as the instantaneous intensity matches the code, the system continues to operate. However, if the instantaneous intensity represented by the feedback signal does not match the code in the output current from the driver, the output power from the driver is immediately ceased and the laser diode shuts down immediately, or as mentioned above the power level to the laser can be cut to a safe level so that the laser output does not harm the human eye.

The combination of the using a modulated code in the laser beam, and detecting the instantaneously intensity of the light emitted from the phosphor only, ensures that the detected signal does not derive from another source or a reflection of the laser beam, and that the system reliably enters a fail state when code-modulated light is not emitted from the phosphor. Desirably, the code is also random generated, thus rendering it nearly impossible to hack.

The comparison of the feedback signal to the code can be analog or digital, although digital circuitry is most likely required if the code is random generated. Depending on the technique for comparing the feedback signal to the code, a delay circuit or other delay mechanism may be required in order to sync the feedback signal to the code modulated output current.

In another aspect, the invention is directed to a laser-driven remote phosphor luminaire comprising a phosphor that emits non-coherent, visible light when excited, a laser diode that emits a laser beam to excite the phosphor, and a driver that outputs electrical DC power at or above the voltage level necessary to drive the laser diode. The luminaire also includes a photodiode with an optical filter (band stop or low pass) for sensing light emitted from the phosphor and for outputting a feedback signal. The driver includes controller that modulates the current output from the driver with a code, compares the feedback signal to the code, and ceases current output and power to the laser diode, or reduces the current output and power to the laser diode to a safe level, in the event that the feedback signal does not match the code.

Other aspects and details of the invention are described below in connection with the drawings.

DETAILED DESCRIPTION

Figure 1:
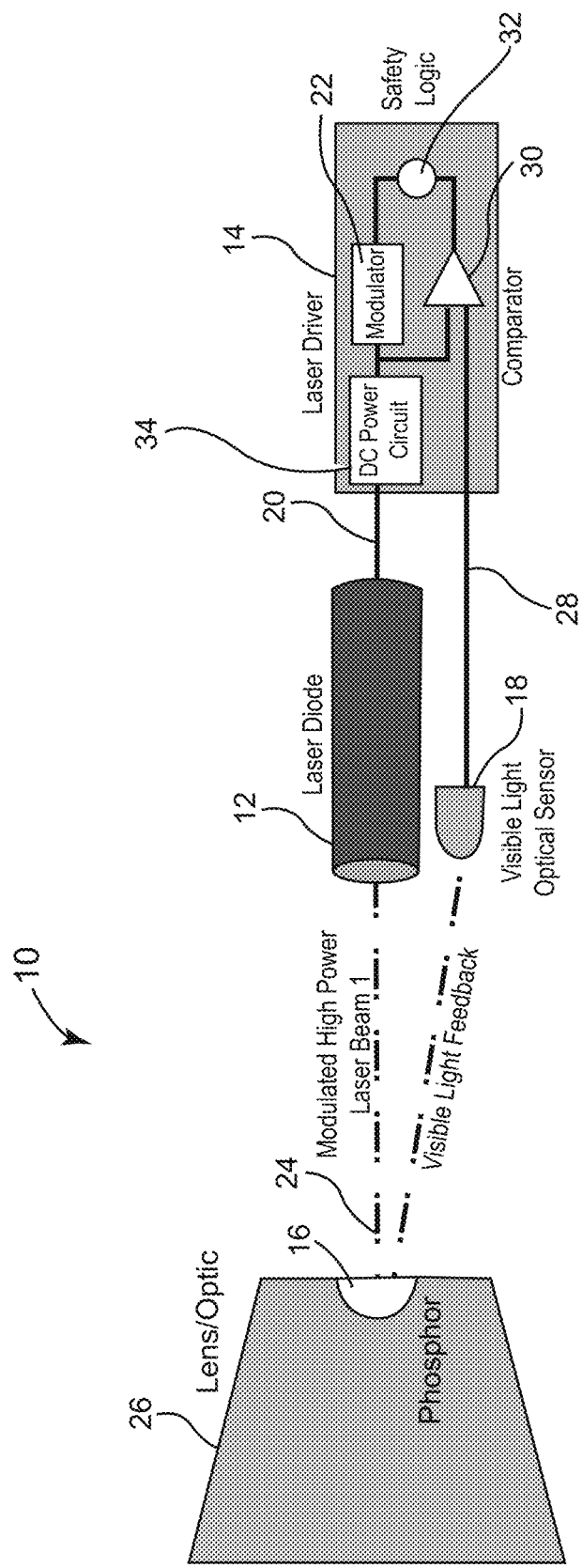
FIG. 1 is a schematic drawing illustrating a luminaire constructed in accordance with an exemplary embodiment of the invention.

FIG. 1 is a schematic diagram illustrating the components of a luminaire 10 that is constructed in accordance with an exemplary embodiment of the invention. The luminaire 10 includes a laser diode 12, a driver 14, a phosphor 16 and a visible light optical sensor 18. As indicated by line 20, the driver 14 outputs electrical DC power at or above a voltage level sufficient to drive the laser diode 12. In this respect, line 20 in FIG. 1 represents lines to both positive and negative terminals for delivering output power from the driver 14 to the laser diode 12. If the luminaire 10 is used as an automobile headlight, the voltage in line 20 would typically be in the range of 10-15 W. Normally, in this type of luminaire 10, the driver 14 would drive the laser diode 12 at a constant current output. However, as indicated in box 22 in FIG. 1, the output current in line 20 is modulated with a code as described in more detail below. The laser diode 12 in response outputs a modulated, high power laser beam 24, which excites the phosphor 16.

The phosphor 16 emits non-coherent light through the lens 26 for purposes of illumination. The duty cycle of the modulated current 20 supplied to the laser diode 12 is selected so that the off periods for the laser diode 16 after phosphor excitation are not noticeable by the human eye during normal operation. The visible light optical sensor 18 detects the light emitted from the phosphor 16 and generates a feedback signal which is transmitted in line 28 to the driver 14. A feedback amplifier 56 (FIG. 3) amplifies, if necessary, the signal (e.g., 3 mA maximum) suitable for processing. The driver 14 in the system 10 shown in FIG. 1 has a comparator 30 that compares the code in the modulated current output from the driver 14 in line 20 to the code in the detected feedback signal 28. The comparator 30 can be analog. However, it is contemplated that the feedback signal in line 28, possibly amplified, be converted to a digital signal for processing. In this case, the comparator 30 is implemented via a programmed processor. As long as the code in the modulated current output 20 matches the code in the feedback signal 28, the system 10 remains operational. However, in the event that the code in the feedback signal 28 does not match the code in the output current 20, then the safety logic 32 in the driver 14 immediately and automatically shuts down the system 10 for safety purposes. Alternatively, the level of laser output can be reduced to a safe level, e.g., 1 W or less, that is not harmful to the human eye but high enough to excite the phosphor to a lesser extent than if the system were fully operational.

Figure 2:
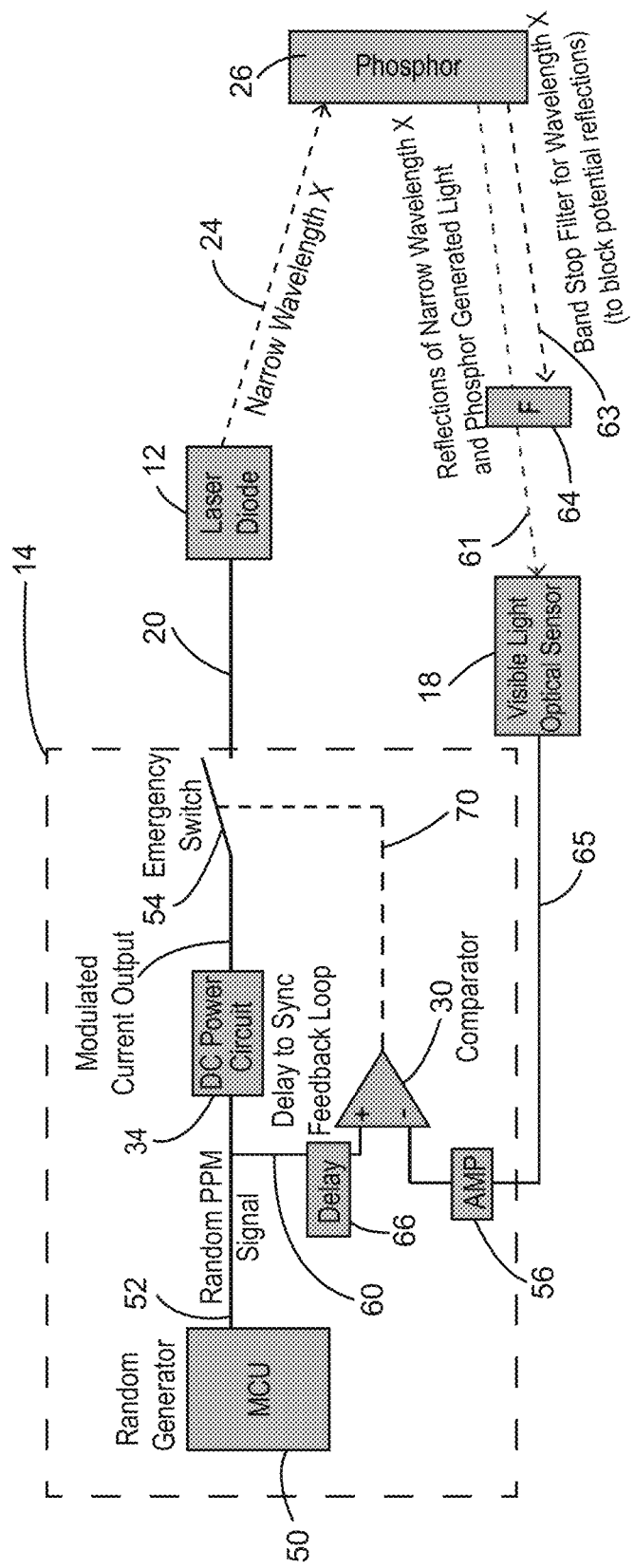
FIG. 2 is a block diagram describing the operation of circuitry associated with the exemplary embodiment of the invention.

FIG. 2 shows additional details of the invention. In FIG. 2, a microcontroller unit 50 in the driver 12 is programmed to generate a random code, a pseudo random code or a calculated random code. Using a random code, pseudo random or calculated random code helps to prevent the system from being hacked. Random code software, pseudo random code software and calculated random code software are well known in the art, and the invention is not limited to any particular method of random number or random code generation. It should also be noted that hardware random code generators or pseudo random code generators can also be used. For example, in accordance with the invention, one could use an integrated circuit having 555 time sequence functionality, and more particularly two 555 circuits in series to generate a semi-random code.

Still referring to FIG. 2, the microcontroller unit 50 outputs a pulse modulated signal, see line 52, where the modulation embodies the code, which is desirably random as discussed above. The Microchip PIC16F84A is suitable for the microcontroller unit 50. This particular controller has a clock speed of 20 MHz. The pulse modulated signal in line 52 controls the DC power circuit 34 to generate power at a voltage sufficient to drive the laser diode 12 with a modulated current output. The power the current output modulated to embody the code generated by the MCU 50 is transmitted through the emergency switch 54 to the laser diode 12. The emergency switch 56 can take a variety of forms, e.g. a coil relay or a solid state transistor. As an alternative to the emergency switch 54 disconnecting power transmitted from the driver 14 to the laser diode 12, the invention can be implemented by disconnecting power to the driver 14 all together. Alternatively, as mentioned above, the level of laser output can be reduced to a safe level that is not harmful to the human eye instead of shutting down the laser diode 12 completely. To do this, the DC power circuit 34 can be controlled to reduce the level of power to the laser diode 12.

If the laser diode 12 receives power under normal working conditions, it outputs a high powered laser beam along a narrow wavelength X as shown by dotted line 24, in order to excite the phosphor 26. The phosphor 26 emits non-coherent light, e.g. for purposes of illumination and also emits visible light rearward towards the visible light optical sensor 18.

The invention is not limited to a specific type of laser diode 12 or phosphor 26. Exemplary laser diodes 12 include near UV, blue-violet lasers that outputs a monochromatic beam 24 having a wavelength of or about 405 nm, or blue lasers outputting a monochromatic beam 24 having a wavelength of or about 450 nm. Indium gallium nitride laser diodes are common, and most likely suitable for this application depending on the selected phosphor 16.

The phosphor 16 is formed by, for example, dispersing a yellow fluorescent substance in a resin-based material as is know in the art. The phosphor 16 absorbs the laser light emitted from the laser diode 12, and then emits light of a color determined by the fluorescent substance dispersed in the phosphor 12. The fluorescent substance should be chosen to be suitable for a given application. For instance, when used for automobile headlights, the phosphor should be yellow in order to generate white light, preferably having a color temperature of about 5500 degrees Kelvin. The invention can be used, for example, with luminaires designed for automobile headlights having phosphor targets made of NYAG (Garnet), GAL (Aluminate), Silicatest, Red Nitrade or KSF. In any event, the phosphor must have a sufficiently high saturation point as well as the capability to discharge quickly compared to the frequency of modulation.

An optical filter 64 is provided between the phosphor 26 and the visible light optical sensor 18. The optical filter 64 can be a band stop filter to block reflections of the laser beam 58 in a narrow range including the wavelength X. The band stop filter 64, however, allows phosphor generated light to pass and be detected by the visible light optical sensor 18. In turn, the optical sensor 18 outputs a signal corresponding to the detected level of the visible light emitted by the phosphor 26, which has embedded within it the code. A suitable band stop filter 64 is dichroic glass designed to block near blue light, if the laser diode 56 outputs a light beam having a wavelength of about 405 nm. It is also possible that the optical filter 64 be configured to act as a low pass filter, such that the filter 64 blocks light at or near the frequency of the waveform of the laser beam 24 and higher frequencies, but allows light at lower frequencies to pass to the visible light sensor.

The optical sensor 62 is a photodiode capable of sensing changing light levels and outputting an analog feedback signal with minimal latency. A suitable optical sensor is the Vishay TEPT4400 ambient light sensor. This sensor is a silicon NPN epitaxial planar photorestistor in a T-1 package. It is sensitive to visible light much like the human eye and has peak sensitivity at a wavelength of 570 nm. It may be desirable to use a load resistor in connection with the sensor to provide a more consistent output response. The sensor 62 outputs an analog current typically in μA corresponding to the detected level of visible light. The response time of the noted ambient light sensor 62 is sufficient to provide a relatively clean signal as the level of reflected light changes from full illumination to no illumination at the desired sampling rates of between 500 Hz and 10 kHz.

Figure 3:
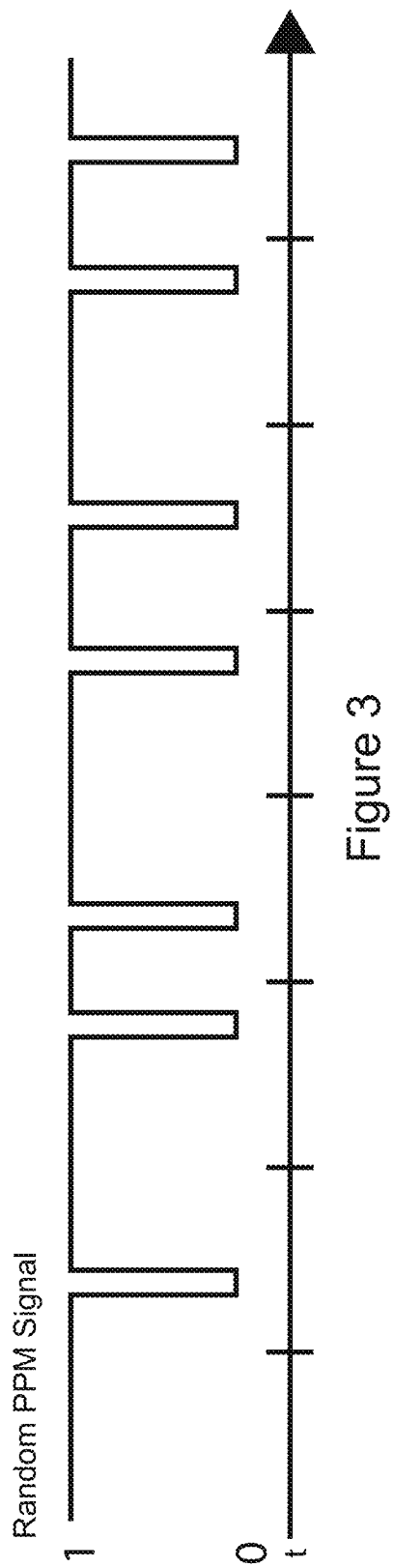
FIG. 3 is a plot showing a random code in a pulse position modulated (PPM) signal.

FIG. 3 shows an example plot of a random pulse position modulated current signal generated in the MCU 50. FIG. 3 shows a square wave in which "on time" is represented by a 1 value and "off time" is represented by a 0 value. The x axis is time. The code is embedded as a binary code. The "off time" for each pulse is constant but the timing of the respective pulses is generally different for each sample period. The high duty cycle [i.e., duty cycle="on time"/(total of "on time" and "off time")] ensures minimum transmission power loss (e.g. below 3% "off time" is desired). As mentioned previously, the frequency of the pulse should be between 500 Hz and 10 kHz so that the pulses are not noticeable to the human eye and the risk of saturating the phosphor 26 is avoided; although it is more desirable that the frequency of the pulse be between 1 kHz and 5 kHz. In FIG. 3, and the length of the "off time" is variable, however, in other embodiments of the invention the "off time" is static.

Referring again to FIG. 2, the PPM signal is transmitted from the MCU 50 to the DC power circuit 34. FIG. 2 also shows a reference signal, which is a copy of the PPM signal, sent through line 60 to a delay circuit 66 and then to the comparator 30. The purpose of the delay circuit 66 is to account for the latency of the transmission of the code through the laser diode 12, then the transmission of the narrow wavelength X laser beam 24 to the phosphor 26, the emission of visible light 61 through the band stop filter 64 to block reflections in the range of wavelength X (63) to the visible light optical sensor 18, and the transmission of the signal in line 65 from the optical sensor 18 to the comparator 30, which may include an amplifier 56 and/or an analog to digital converter. Assuming that the delay circuit 66 appropriately accounts for the latency in the feedback loop, the comparator 30 outputs a control signal 70 to maintain the emergency switch 54 in the closed position. However, if the signals do not match, the comparator 30 sends a signal to open the emergency switch 54. Alternatively, the emergency switch 54 is biased to an open position, and a control signal in line 70 keeps the switch 54 closed as long as the signals match.

The delay circuit 66, comparator 30 and emergency switch 54 are shown functionally in FIG. 2, and can be implemented as analog components but are preferably implemented as digital components. The Microchip PIC16F84A has a clock speed of 20 MHz and is well suited to accommodate modulation within the range of 500 Hz to 10 kHz, and to process the signals digitally. In a digital system, reference data corresponding to PPM signal sent to the DC power circuit 34 is stored. The analog feedback signal in line 65 from the visible light detector 18 is amplified (56) and converted to digital data for example at the same sampling rate as the reference data. Then, software on the MCU 50 compares the code detected in the digital feedback data to the code in the reference data. If necessary, the reference data can be shifted in time to account for system latency. If there is not a match, the MCU 50 can then control a transistor (54) to cut power from the DC power circuit, to cut power to the DC power circuit, or control the DC power circuit 34 to reduce the power to the laser diode 12 to a safe level. Since the sampling rate should be several magnitudes faster than the frequency of the "off" times in the digital feedback signal, the comparison detection algorithm can account for the edge effects of the detected feedback signal to avoid unnecessary shutdown. For example, when comparing data, it may be desirable to sample data in the feedback signal that are expected in time to be in the center of the "off" pulse in order to avoid issues with signal recovery and noise.

In order to avoid the need for a delay to account for feedback latency, the system can use differential pulse-position modulation, whereby each pulse position is encoded relative to the previous pulse position.

Figure 4:
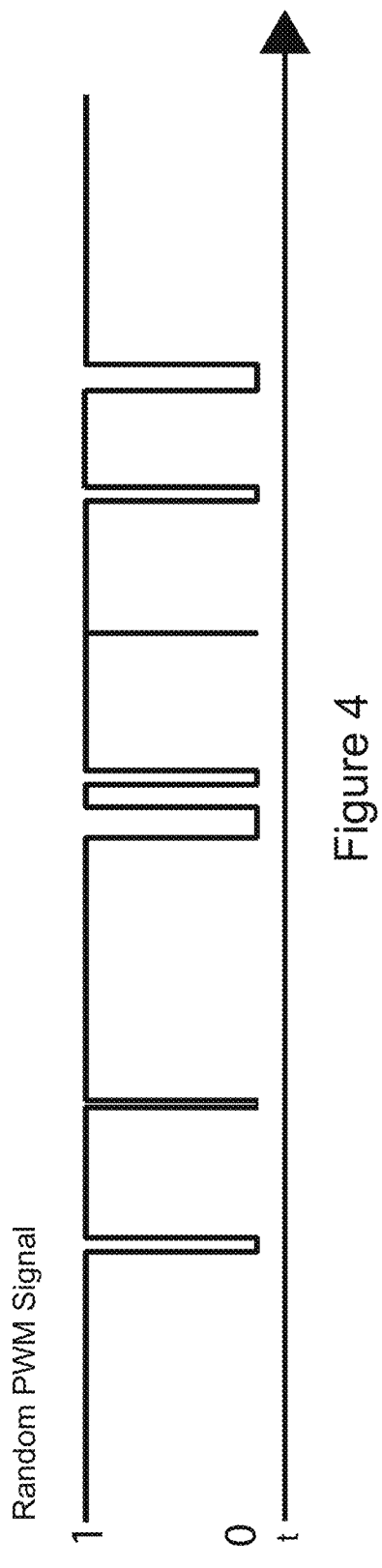
FIG. 4 is a plot showing a random code in pulse wave modulated (PWM) signal.

Pulse position modulation (PPM) is well suited for this application, and has several advantages over other types of modulation that can be used to implement the invention. Since the length of the "off" time does not vary with PPM, the light illuminated from the phosphor 26 is more stable than modulation techniques, such as pulse width modulation (PWM), that vary the length of the "off" time in the duty cycle. Also, with PPM the duty cycle can be kept high without sacrificing the ability to transmit the code through the system. FIG. 4 shows an exemplary PWM signal embedding a code in accordance with an alternative embodiment of the invention. The pulses have various lengths but are sent are regular intervals (e.g. the carrier frequency of modulation). As mentioned, the invention can be implemented using a number of modulation techniques.

It is expected in an automobile headlight system that the invention be applied independently to each laser diode. If a separate driver, laser diode and phosphor are used for the high beam and low beam on each side of the vehicle, then each of the four drivers should include its own independent safety system (e.g., code generator, current modulation, light sensor, delay circuit and comparator or digital equivalent). If a reflector is used to redirect the laser beam to different phosphors for the high beam and low beam on each side of the vehicle, the system will likely have one driver and laser diode per side. In this case, it is desirable to have a separate light sensor for the low beam and high beam on each side, although the other aspects of the safety system (e.g., code generator, current modulation, delay circuit and comparator or digital equivalent) for each side can be shared.

In the foregoing description, certain terms have been used for brevity, clarity, and understanding. No unnecessary limitations are to be inferred therefrom beyond the requirement of the prior art because such terms are used for descriptive purposes and are intended to be broadly construed. The different configurations, systems, and method steps described herein may be used alone or in combination with other configurations, systems and method steps. It is to be expected that various equivalents, alternatives and modifications are possible within the scope of the appended claims. Each limitation in the appended claims is intended to invoke interpretation under 35 U.S.C. § 112, sixth paragraph, only if the terms "means for" or "step for" are explicitly recited in the respective limitation.

What is claimed is:

1. A laser-driven remote phosphor luminaire comprising:
   a phosphor that emits non-coherent, visible light when excited;
   a laser diode that emits a laser beam to excite the phosphor;
   a driver that outputs electrical DC power at or above the voltage level necessary to drive the laser diode, wherein the driver includes a controller that is programmed to modulate the current output from the driver with a code;
   an optical sensor for sensing light emitted from the phosphor and for outputting a feedback signal to the controller;
   wherein the controller compares the feedback signal to the code, and ceases current output and power to the laser diode or reduces current output and power to the laser diode to a level safe for the human eye in the event that the feedback signal does not match the code.

2. A laser-driven remote phosphor luminaire as recited in claim 1 further comprising:
   a band stop optical filter that blocks light at the wavelength of the laser diode, said band stop filter filtering light sensed by the optical sensor.

3. A laser-driven remote phosphor luminaire as recited in claim 1 further comprising:
   a low pass optical filter that blocks light at the wavelength of the laser diode, said low pass filter filtering light sensed by the optical sensor.

4. A laser-driven remote phosphor luminaire as recited in claim 1 wherein:
   the laser diode emits near UV light having a wavelength of 410 nm to 420 nm; and
   the optical sensor detects visible light.

5. A laser-driven remote phosphor luminaire as recited in claim 1 wherein:
   the current output to the laser diode is pulse modulated and the frequency of the pulses is no less than 500 Hz and no greater than 10 kHz.

6. A laser-driven remote phosphor luminaire as recited in claim 1 wherein:
   the current output to the laser diode is pulse modulated and the frequency of the pulses is no less than 1 kHz and no greater than 5 kHz.

7. A laser-driven remote phosphor luminaire as recited in claim 1 wherein the selected code is one of random generated, pseudo random generated and calculated random generated.

8. A laser-driven remote phosphor luminaire as recited in claim 1 wherein the phosphor generates white light having a color temperature of about 5500 degrees Kelvin.

9. A laser-driven remote phosphor luminaire as recited in claim 1 further comprising an emergency switch that is normally closed to transmit power from the driver to the laser diode, wherein the controller opens the switch and ceases current output and power to the laser diode in the event that the feedback signal does not match the code.

10. A laser-driven remote phosphor luminaire as recited in claim 1 further comprising an amplifier that receives the feedback signal from the optical sensor and outputs an amplified feedback signal, and analog to digital converter that receives the amplified feedback signal and outputs a digital feedback signal for use by the controller.

11. A vehicle comprising the laser-driven remote phosphor luminaire as recited in claim 1.

12. A method of identifying a malfunction in a laser driven remote phosphor luminaire comprising the steps of:
   providing a phosphor, a laser diode that emits a laser beam to excite the phosphor to emit non-coherent visible light, and a driver that outputs electrical DC power at or above a voltage level sufficient to drive the laser diode;
   selecting a code;
   modulating a current of the electrical DC power output from the driver so that the laser diode outputs a laser beam modulated with the selected code;
   sensing visible light emitted from the phosphor with an optical sensor and outputting a feedback signal;
   comparing the feedback signal to the code; and
   cutting the power of the laser beam to a level safe for the human eye or to zero if the feedback signal does not match the code.

13. The method as recited in claim 12 wherein the step of cutting the power of the laser beam if the feedback signal does not match the code comprises ceasing to output DC power from the driver immediately if the feedback signal does not match the code in order to shut down the laser diode.

14. The method as recited in claim 13 wherein visible light emitted from the phosphor passes through an optical filter prior to being sensed with the sensor, said optical filter blocking light at the wavelengths emitted by the laser.

15. The method as recited in claim 14 wherein the optical filter is a dichroitic band stop filter.

16. The method as recited in claim 14 wherein the optical filter is a low pass filter.

17. The method as recited in claim 12 wherein the current output is pulse position modulated at different off times to modulate the laser beam with the selected code.

18. The method as recited in claim 12 wherein the selected code is random, pseudo-random or calculated random.

19. The method as recited in claim 12 wherein the frequency of the modulated current output is no less than 500 Hz and no greater than 10 kHz.

20. The method as recited in claim 19 wherein the frequency of the modulated current output is no less than 1 kHz and no greater than 5 kHz.

21. The method as recited in claim 12 wherein the step of comparing the feedback signal to the code comprises providing reference data corresponding to modulated current output from the driver, offsetting the reference data in time with respect to feedback signal in order to synchronize the reference data to the feedback signal, and comparing the feedback signal to the offset reference data.

22. The method as recited in claim 12 wherein the step of comparing the feedback signal to the code comprises providing reference data corresponding to modulated current output from the driver, and comparing the code detected in the feedback signal to the code in the reference data.

23. The method as recited in claim 12 wherein the duty cycle of the modulated current output is at or above 97%.

* * * * *